(12) United States Patent
Sakurauchi et al.

(10) Patent No.: US 11,056,631 B2
(45) Date of Patent: Jul. 6, 2021

(54) THERMOELECTRIC CONVERSION MODULE

(71) Applicant: YAMAHA CORPORATION, Hamamatsu (JP)

(72) Inventors: Kazushi Sakurauchi, Hamamatsu (JP); Takahiro Hayashi, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 11 days.

(21) Appl. No.: 16/432,224

(22) Filed: Jun. 5, 2019

(65) Prior Publication Data

US 2019/0378966 A1 Dec. 12, 2019

(30) Foreign Application Priority Data

Jun. 12, 2018 (JP) .............................. JP2018-112267

(51) Int. Cl.
*H01L 35/08* (2006.01)
*H01L 35/16* (2006.01)

(52) U.S. Cl.
CPC .............. *H01L 35/08* (2013.01); *H01L 35/16* (2013.01)

(58) Field of Classification Search
None
See application file for complete search history.

(56) References Cited

U.S. PATENT DOCUMENTS

2008/0308140 A1* 12/2008 Nakamura .............. H01L 35/32
136/200

FOREIGN PATENT DOCUMENTS

JP 2008010612 A 1/2008

OTHER PUBLICATIONS

Machine Translation Fujimoto JP 2008010612A, accessed Apr. 13, 2020 (Year: 2008).*

* cited by examiner

*Primary Examiner* — Shannon M Gardner
(74) *Attorney, Agent, or Firm* — Rossi, Kimms & McDowell LLP

(57) ABSTRACT

A thermoelectric conversion module includes: a substrate; a plurality of thermoelectric elements including an N-type element and a P-type element; a bonding layer including silver and disposed between the substrate and the plurality of thermoelectric elements; a first electrode that connects the N-type element with the bonding layer, the first electrode including a first nickel layer and an aluminum layer that is disposed between the first nickel layer and the N-type element; and a second electrode that connects the P-type element with the bonding layer, the second electrode including a second nickel layer.

13 Claims, 6 Drawing Sheets

US 11,056,631 B2

THERMOELECTRIC CONVERSION MODULE

CROSS-REFERENCE TO RELATED APPLICATION

Priority is claimed on Japanese Patent Application No. 2018-112267, filed Jun. 12, 2018, the content of which is incorporated herein by reference.

BACKGROUND OF THE INVENTION

Field of the Invention

The present invention relates to a thermoelectric conversion module utilizing a thermoelectric element.

Description of Related Art

Japanese Unexamined Patent Application, First Publication No. 2008-10612 (hereinafter referred to as Patent Document 1) describes a thermoelectric conversion module in which a thermoelectric element is soldered to a substrate. In this thermoelectric conversion module, a diffusion prevention layer is disposed between the thermoelectric element and the solder so that components such as solder can be prevented from diffusing into the thermoelectric element. For the diffusion prevention layer, any one of molybdenum, tungsten, niobium, and tantalum is used.

SUMMARY OF THE INVENTION

Thermoelectric conversion modules utilized for thermoelectric power generation are exposed to a high temperature of 250° C. or higher. Therefore, in thermoelectric conversion modules using solder, sufficient heat resistance may not be obtained. Also, in the diffusion prevention layer described in Patent Document 1, there are cases in which diffusion of components such as solder into the thermoelectric element cannot be sufficiently prevented at a high temperature.

In consideration of the above-described circumstances, an objective of the present invention is to provide a thermoelectric conversion module having high heat resistance.

In order to achieve the above-described objective, a thermoelectric conversion module according to one aspect of the present invention includes a substrate, a plurality of thermoelectric elements, a bonding layer, a first electrode, and a second electrode. The plurality of thermoelectric elements include an N-type element and a P-type element. The bonding layer includes silver and is disposed between the substrate and the plurality of thermoelectric elements. The first electrode connects the N-type element with the bonding layer. The first electrode includes a first nickel layer and an aluminum layer that is disposed between the first nickel layer and the N-type element. The second electrode connects the P-type element with the bonding layer. The second electrode includes a second nickel layer.

A thermoelectric conversion module having high heat resistance can be provided.

DETAILED DESCRIPTION OF THE INVENTION

Figure 1:
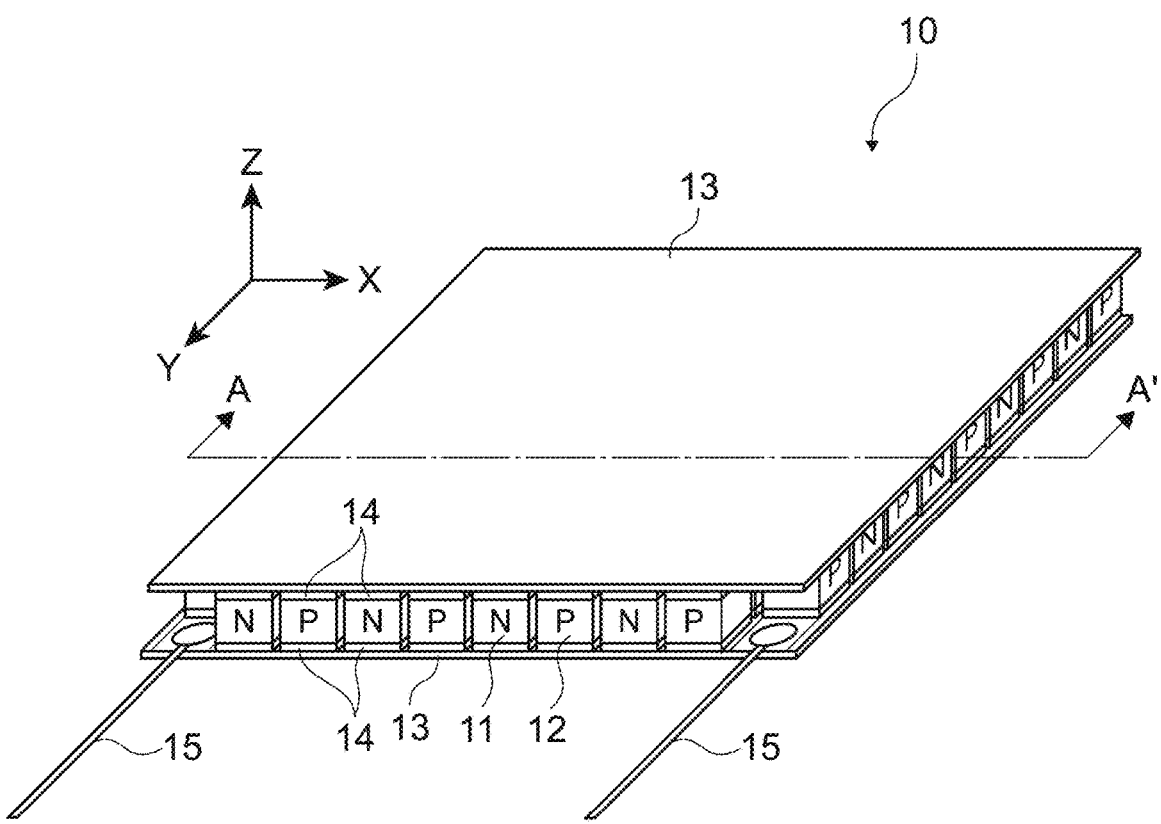
FIG. 1 is a perspective view of a thermoelectric conversion module according to one embodiment of the present invention.

Hereinafter, embodiments of the present invention will be described with reference to the drawings.

In the drawings, an X axis, a Y axis, and a Z-axis which are perpendicular to one another are illustrated as appropriate. The X axis, the Y axis and the Z-axis are common to all the drawings.

[Overall Configuration of Thermoelectric Conversion Module 10]

FIG. 1 is a perspective view of the thermoelectric conversion module 10 according to one embodiment of the present invention. The thermoelectric conversion module 10 has a configuration particularly suitable for application to thermoelectric power generation. The thermoelectric conversion module 10 includes N-type chips 11, P-type chips 12, a pair of substrates 13, a bonding layer 14, and a pair of lead wires 15.

The pair of substrates 13 each extend along an XY plane and face each other in a Z-axis direction. The N-type chips 11 and the P-type chips 12 are paired with each other. The N-type chips 11 and the P-type chips 12 are arranged between the substrates 13. The bonding layer 14 bonds the substrates 13 to the chips 11 and 12. The pair of lead wires 15 are each bonded to the substrate 13 on a lower side in the Z-axis direction.

In the thermoelectric conversion module 10, an upper substrate 13 in the Z-axis direction is configured as a high temperature side substrate, and a lower substrate 13 in the Z-axis direction is configured as a low temperature side substrate. That is, when the thermoelectric conversion module 10 is used for thermoelectric power generation, the upper substrate 13 is heated and the lower substrate 13 dissipates heat, and thereby a temperature difference is formed between the upper and lower substrates 13.

The bonding layer 14 is a layer that includes silver. Preferably, the bonding layer 14 is a layer that includes silver as a main component. In the present embodiment, the bonding layer 14 is formed of a sintered material that includes silver as a main component. Here, in the present specification, "%" means "mass %". The expression of "silver as a main component" means that 60% or more, preferably 90% or more of the composition of the bonding layer 14 or the sintered material is silver. A silver paste including silver particles as a main component is used to form the bonding layer 14. More specifically, the bonding layer 14 is formed by heat treating the silver paste disposed between the substrates 13 and the chips 11 and 12 and sintering the silver particles constituting the silver paste.

The silver particles constituting the silver paste can be sintered, for example, at a low temperature of about 100 to 300° C. Therefore, a process of forming the bonding layer 14 can be performed at a low temperature. Thereby, the substrates 13 and the chips 11 and 12 can be bonded at low cost while suppressing damage to the chips 11 and 12 due to heat.

On the other hand, the silver constituting the bonding layer 14 has a high melting point. Therefore, even when the thermoelectric conversion module 10 is exposed to a high temperature of 250° C. or more, the bonding layer 14 does not melt, and connections between the substrates 13 and the chips 11 and 12 are maintained satisfactorily. In this way, the thermoelectric conversion module 10 has high heat resistance.

For the silver paste for forming the bonding layer 14, for example, a silver nano-paste including silver particles having sizes smaller than 100 nm as a main component may be used. For the silver nano-paste, for example, the Silver nano-paste manufactured by Dowa Electronics Materials Co., Ltd., NAG-10 manufactured by Daiken Chemical Industry Co., Ltd., MDot (registered trademark in Japan) manufactured by Mitsuboshi Belting Ltd., or the like can be utilized.

Figure 2:
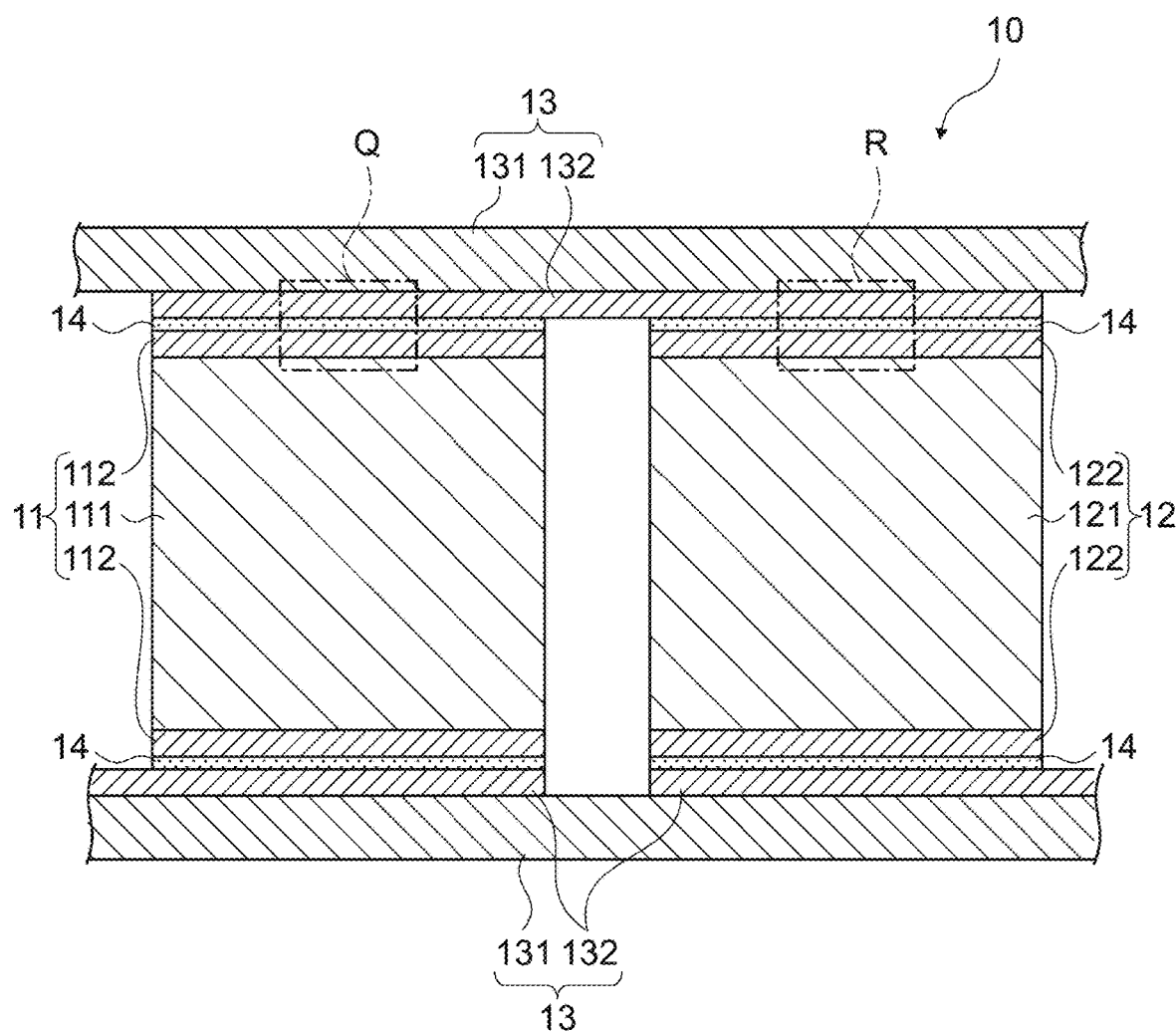
FIG. 2 is a partial cross-sectional view of the thermoelectric conversion module taken along line A-A' of FIG. 1.

FIG. 2 is a partial cross-sectional view of the thermoelectric conversion module 10 taken along line A-A' of FIG. 1. FIG. 2 is an enlarged view of a pair of the N-type chip 11 and the P-type chip 12 and their surroundings. The N-type chip 11 includes an N-type element 111 and a first electrode 112. The P-type chip 12 includes a P-type element 121 and a second electrode 122.

The N-type element 111 and the P-type element 121 are formed of a thermoelectric material and constitute a plurality of thermoelectric elements. That is, the N-type element 111 is formed of an N-type thermoelectric material, and the P-type element 121 is formed of a P-type thermoelectric material. In the present embodiment, the N-type element 111 and the P-type element 121 are formed of bismuth telluride-based compounds having high thermoelectric conversion performance.

Further, the thermoelectric material forming the N-type element 111 and the P-type element 121 may be other than bismuth telluride-based compounds. For example, the thermoelectric material forming the N-type element 111 and the P-type element 121 may be silicide-based compounds, half-Heusler-based compounds, lead telluride-based compounds, silicon germanium-based compounds, skutterudite-based compounds, tetrahedrite-based compounds, colusite-based compounds, or the like.

In each N-type chip 11, the first electrode 112 is provided on upper and lower surfaces of the N-type element 111. In each P-type chip 12, the second electrode 122 is provided on upper and lower surfaces of the P-type element 121. Detailed configurations of the first electrode 112 of the N-type chip 11 and the second electrode 122 of the P-type chip 12 will be described below.

Each of the substrates 13 includes a base material 131 and a metallized layer 132. In the upper substrate 13, the metallized layer 132 is patterned on a lower surface of the base material 131. In the lower substrate 13, the metallized layer 132 is patterned on an upper surface of the base material 131. The metallized layer 132 is configured as a metal conductive film and functions as an electrode of the substrate 13.

Each base material 131 is configured as a rectangular flat plate parallel to the XY plane. The base material 131 is formed of an insulator material having excellent heat resistance. The base material 131 is preferably formed of a material having high thermal conductivity, and can be formed of, for example, aluminum nitride, aluminum oxide, silicon carbide, silicon nitride, or the like.

The bonding layer 14 bonds the first electrodes 112 of the N-type chip 11 to the metallized layers 132 of the upper and lower substrates 13 and bonds the second electrodes 122 of the P-type chip 12 to the metallized layers 132 of the upper and lower substrates 13. Thereby, all the N-type chips 11 and P-type chips 12 are alternately connected in series via the metallized layers 132 between the substrates 13.

The pair of lead wires 15 are bonded to metallized layers 132 at two corners in the Y-axis direction of the lower substrate 13 which are opposite ends of the series connection of the N-type chips 11 and the P-type chips 12, and are drawn out in the Y-axis direction. Thereby, all the chips 11 and 12 are connected in series between the pair of lead wires 15 in the thermoelectric conversion module 10.

Although a typical configuration of the thermoelectric conversion module 10 according to the present embodiment has been described, the thermoelectric conversion module 10 can employ various configurations according to applications or the like. For example, the number or arrangement of the N-type chips 11 and the P-type chips 12, a shape of the substrate 13, or the like can be appropriately modified from the above-described configuration.

[Detailed Configuration of Thermoelectric Conversion Module 10]

Figure 3:
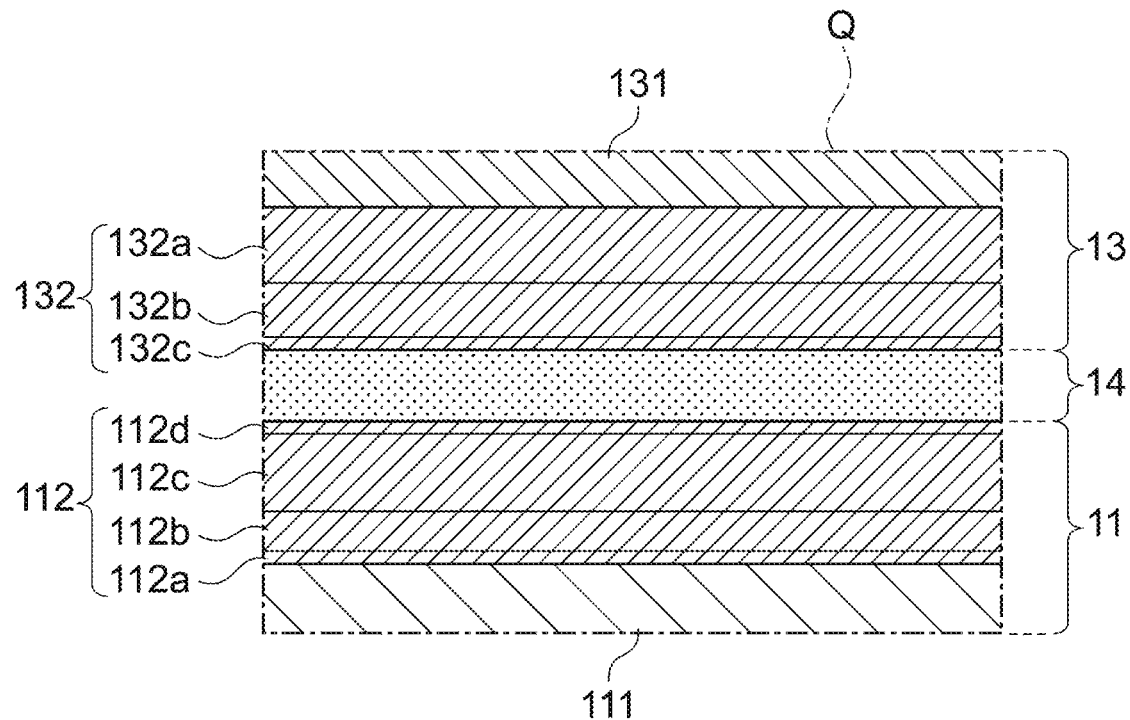
FIG. 3 is an enlarged view of a region Q of FIG. 2 of the thermoelectric conversion module.
Figure 4:
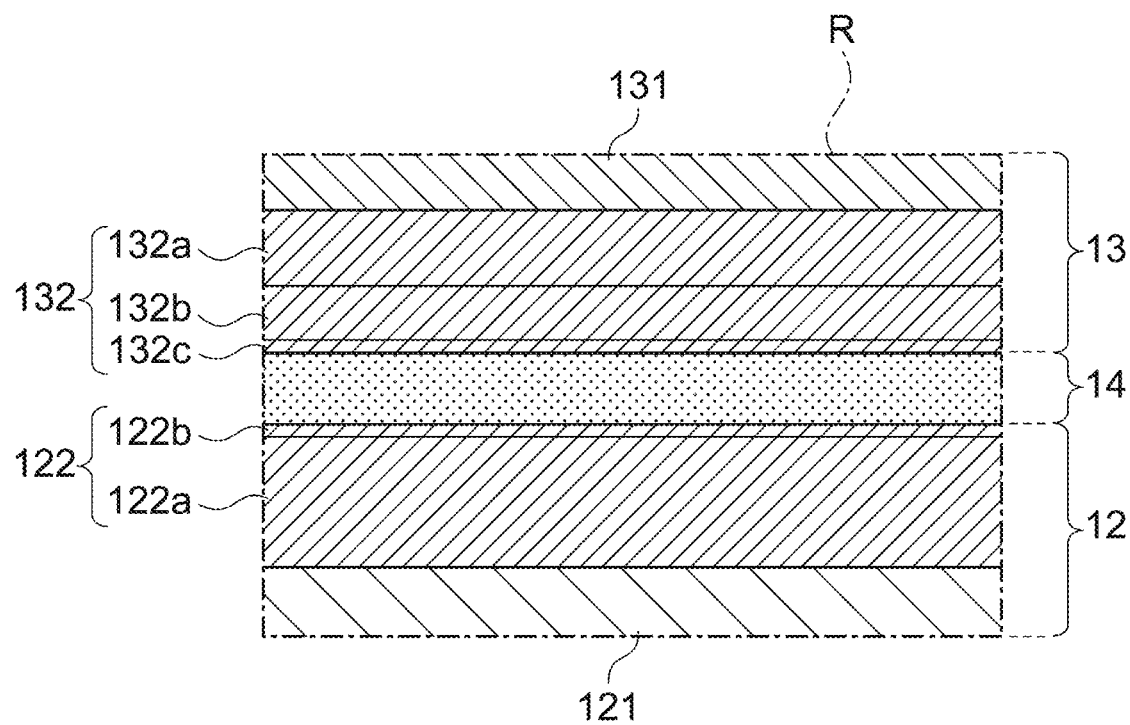
FIG. 4 is an enlarged view of a region R of FIG. 2 of the thermoelectric conversion module.

FIG. 3 is an enlarged view of a region Q surrounded by a dashed-dotted line in FIG. 2. That is, FIG. 3 illustrates the bonding layer 14 in which the upper substrate 13 and the N-type chip 11 are bonded and the vicinity thereof. FIG. 4 is an enlarged view of a region R surrounded by a dashed-dotted line in FIG. 2. That is, FIG. 4 illustrates the bonding layer 14 in which the upper substrate 13 and the P-type chip 12 are bonded and the vicinity thereof.

As illustrated in FIGS. 3 and 4, the metallized layer 132 of the substrate 13 has a three-layer structure. Specifically, the metallized layer 132 includes a copper layer 132a, a nickel layer 132b, and a gold layer 132c that are stacked in this order from the base material 131 side. The copper layer 132a is a layer that includes copper as a main component. The expression of "copper as a main component" means that 60% or more, preferably 90% or more of the composition of the copper layer 132a is copper. The nickel layer 132b is a layer that includes nickel as a main component. The expression of "nickel as a main component" means that 60% or more, preferably 90% or more of the composition of the nickel layer 132a is nickel. The gold layer 132c is a layer that includes gold as a main component. The expression of "gold as a main component" means that 60% or more, preferably 90% or more of the composition of the gold layer 132c is gold.

The copper layer 132a has high conductivity and thus contributes to reduction in electrical resistance of the thermoelectric conversion module 10. The nickel layer 132b mainly prevents interdiffusion of components between the bonding layer 14 and the copper layer 132a. The gold layer 132c enhances a bonding strength with respect to the bonding layer 14. Further, the configuration of the metallized layer 132 can be changed as appropriate.

The metallized layer 132 can be made as a multilayer plating film formed by wet plating. That is, in the above-described example, the metallized layer 132 can be formed as a three-layer plating including the copper layer 132a formed by copper plating, the nickel layer 132b formed by nickel plating, and the gold layer 132c formed by gold plating.

Further, each layer in the metallized layer 132 may not be formed by wet plating and can be formed using an arbitrary known method. For example, in the metallized layer 132, the copper layer 132a may be configured as direct bonded copper (DBC) formed on the base material 131 by a direct bonding method.

As illustrated in FIG. 3, the first electrode 112 of the N-type chip 11 has a four-layer structure. Specifically, the first electrode 112 includes a titanium layer 112a, an aluminum layer 112b, a nickel layer 112c, and a gold layer 112d that are stacked in this order from the N-type element 111 side. The titanium layer 112a is a layer that includes titanium as a main component. The expression of "titanium as a main component" means that 60% or more, preferably 90% or more of the composition of the titanium layer 112a is titanium. The aluminum layer 112b is a layer that includes aluminum as a main component. The expression of "aluminum as a main component" means that 60% or more, preferably 90% or more of the composition of the aluminum layer 112b is aluminum. The nickel layer 112c is a layer that includes nickel as a main component. The expression of "nickel as a main component" means that 60% or more, preferably 90% or more of the composition of the nickel layer 112c is nickel. The gold layer 112d is a layer that includes gold as a main component. The expression of "gold as a main component" means that 60% or more, preferably 90% or more of the composition of the gold layer 112d is gold.

The first electrode 112 can be formed by wet plating. That is, the titanium layer 112a can be formed by titanium plating, the aluminum layer 112b can be formed by aluminum plating, the nickel layer 112c can be formed by nickel plating, and the gold layer 112d can be formed by gold plating. In this way, the first electrode 112 can be formed in consecutive processes.

Further, each layer of the first electrode 112 may not be formed by wet plating and can be formed using an arbitrary known method. For example, the titanium layer 112a, the aluminum layer 112b, and the nickel layer 112c may be formed using a dry deposition method or may be formed using methods different from each other.

The titanium layer 112a of the first electrode 112 is configured as an adhesion layer for enhancing adhesion between the N-type element 111 formed of a bismuth telluride-based compound and the aluminum layer 112b. Further, such an adhesion layer can be arbitrarily changed in accordance with types or the like of the N-type element 111 and can be omitted as appropriate.

The gold layer 112d of the first electrode 112 is configured as a cap metal for enhancing wettability of a silver paste when the bonding layer 14 is formed. Due to the effect of the gold layer 112d, a bonding strength between the first electrode 112 and the bonding layer 14 is enhanced. Further, such a cap metal can be changed to another metal layer as necessary and can be omitted as appropriate.

For example, as the cap metal, a silver layer including silver as a main component can be provided instead of the gold layer 112d. In this manner, since a main component of the cap metal is made of the same type of metal as the main component of the bonding layer 14, affinity between the cap metal and the bonding layer 14 is further increased. As a result, the bonding strength between the first electrode 112 and the bonding layer 14 is further enhanced.

Also, the gold layer 132c of the metallized layer 132 of the substrate 13 also functions as a cap metal for enhancing wettability of the bonding layer 14 in the same manner as the gold layer 112d of the first electrode 112. Therefore, also in the metallized layer 132, a bonding strength between the bonding layer 14 and the metallized layer 132 is enhanced by providing a silver layer including silver as a main component as the cap metal instead of the gold layer 132c.

The aluminum layer 112b and the nickel layer 112c constitute a diffusion prevention layer that prevents components constituting the bonding layer 14 and the first electrode 112 from diffusing into the N-type element 111. Thereby, since change in thermoelectric characteristics of the N-type element 111 can be prevented in the thermoelectric conversion module 10, high thermoelectric conversion performance can be maintained.

More specifically, in the N-type element 111, electrical resistance changes greatly due to diffusion of silver or nickel. Specifically, both silver and nickel act to increase the electrical resistance of the N-type element 111. In the N-type element 111, the change in electrical resistance as described above causes the thermoelectric characteristics to be changed.

In this respect, in the thermoelectric conversion module 10, the diffusion of silver constituting the bonding layer 14 can be prevented by the effect of the nickel layer 112c, and furthermore, diffusion of nickel constituting the nickel layer 112c can be prevented by the effect of the aluminum layer 112b. That is, high thermoelectric conversion performance can be maintained by the two diffusion prevention layers in the thermoelectric conversion module 10.

A thickness of the nickel layer 112c in the first electrode 112 is preferably 7 μm or more. Thereby, the diffusion of silver can be more effectively prevented. It is preferable that the nickel layer 112c is thick as long as peeling or the like does not occur when the nickel layer 112c is formed. In this respect, the thickness of the nickel layer 112c is preferably 50 μm or less. A thickness of the aluminum layer 112b in the first electrode 112 is preferably 2 μm or more. Thereby, the diffusion of nickel can be more effectively prevented. It is preferable that the aluminum layer 112b is thick as long as peeling or the like does not occur when the aluminum layer 112b is formed. In this respect, the thickness of the aluminum layer 112b is preferably 50 μm or less.

In the N-type chip 11, the upper first electrode 112 connected to the substrate 13 on a high temperature side has the above-described configuration, but it is not indispensable that the lower first electrode 112 connected to the substrate 13 on a low temperature side has the above-described configuration. However, when both the upper and lower first electrodes 112 are configured as described above, the heat resistance is further enhanced and plating treatment can be efficiently performed.

As illustrated in FIG. 4, the second electrode 122 of the P-type chip 12 has a two-layer structure. Specifically, the second electrode 122 includes a nickel layer 122a and a gold layer 122b that are stacked in this order from the P-type element 121 side. The nickel layer 122a is a layer that includes nickel as a main component. The expression of "nickel as a main component" means that 60% or more, preferably 90% or more of the composition of the nickel layer 122a is nickel. The gold layer 122b is a layer that includes gold as a main component. The expression of "gold as a main component" means that 60% or more, preferably 90% or more of the composition of the gold layer 122b is gold. Since the nickel layer 122a has excellent adhesion to the P-type element 121, an adhesion layer is unnecessary.

As in the first electrode 112 of the N-type chip 11, the second electrode 122 can be formed by wet plating. That is, the nickel layer 122a can be formed by nickel plating, and the gold layer 122b can be formed by gold plating. In this way, the second electrode 122 can be formed in consecutive processes.

Further, each layer in the second electrode 122 may not be formed by wet plating and can be formed using an arbitrary known method. For example, the nickel layer 122a and the gold layer 122b may be formed using a dry deposition method or may be formed using methods different from each other.

The gold layer 122b of the second electrode 122 is configured as a cap metal for enhancing wettability of a silver paste when the bonding layer 14 is formed. Due to the effect of the gold layer 122b, a bonding strength between the second electrode 122 and the bonding layer 14 is enhanced. Further, such a cap metal can be changed to another metal layer as necessary and can be omitted as appropriate.

For example, as a cap metal, a silver layer including silver as a main component can be provided instead of the gold layer 122b. In this manner, since a main component of the cap metal is made of the same type of metal as the main component of the bonding layer 14, affinity between the cap metal and the bonding layer 14 is further increased. As a result, the bonding strength between the second electrode 122 and the bonding layer 14 is further enhanced.

The nickel layer 122a constitutes a diffusion prevention layer that prevents the silver constituting the bonding layer 14 from diffusing into the P-type element 121. In the thermoelectric conversion module 10, since decrease in electrical resistance due to the diffusion of the silver in the P-type element 121 can be prevented by the effect of the nickel layer 122a, high thermoelectric conversion performance can be maintained.

The nickel constituting the nickel layer 122a has an effect of increasing electrical resistance of the P-type element 121. Therefore, as in the first electrode 112, the second electrode 122 may have an aluminum layer between the nickel layer 122a and the P-type element 121, as a diffusion prevention layer for the nickel constituting the nickel layer 122a.

When the aluminum layer is provided between the nickel layer 122a and the P-type element 121, for example, a titanium layer is preferably provided as an adhesion layer for enhancing adhesion between the P-type element 121 and the aluminum layer. The aluminum layer and the titanium layer can be formed in the same manner as the titanium layer 112a and the aluminum layer 112b described above.

However, nickel has a property of easily diffusing into the N-type element 111 and not easily diffusing into the P-type element 121. That is, in the P-type chip 12, unlike in the N-type chip 11, the nickel constituting the nickel layer 122a does not easily diffuse into the P-type element 121. Therefore, an aluminum layer may not be provided in the second electrode 122.

Figure 5:
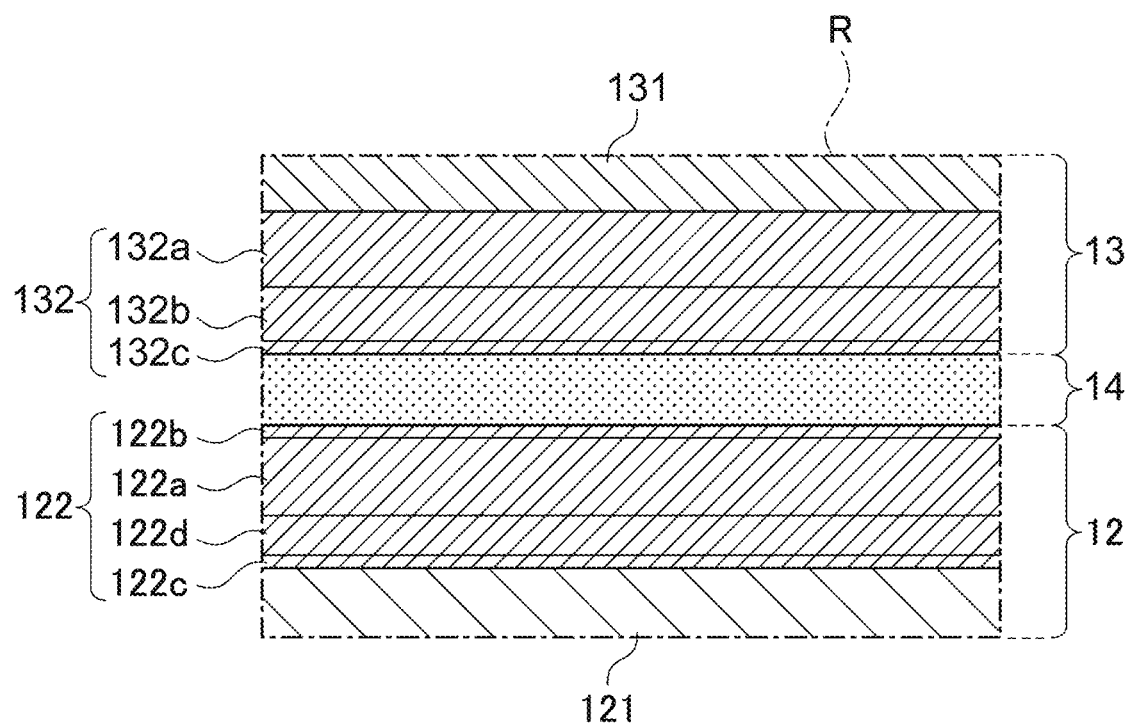
FIG. 5 is a modified example of the region R in FIG. 4.

However, as shown in FIG. 5, it is preferable that the second electrode 122 further includes an aluminum layer 122d and a titanium layer 122c. In the modified example of FIG. 5, the configuration of the second electrode 122 is different from the configuration of the second electrode 122 shown in FIG. 4. Except for the above, the second electrode 122 of FIG. 5 has the same configuration as that shown in FIG. 4. In the modified example shown in FIG. 5, the second electrode 122 includes the titanium layer 122c, the aluminum layer 122d, a nickel layer 122a, and a gold layer 122b that are stacked in this order from the P-type element 121 side. The nickel layer 122a and the gold layer 122b are the same as those shown in FIG. 4. The titanium layer 122c is a layer that includes titanium as a main component. The expression of "titanium as a main component" means that 60% or more, preferably 90% or more of the composition of the titanium layer 122c is titanium. The titanium layer 122c can be formed in the same manner as the titanium layer 112a. The aluminum layer 122d is a layer that includes aluminum as a main component. The expression of "aluminum as a main component" means that 60% or more, preferably 90% or more of the composition of the aluminum layer 122d is aluminum. The aluminum layer 122d can be formed in the same manner as the aluminum layer 112b.

The explanation returns to the second electrode 122 of FIG. 4. A thickness of the nickel layer 122a in the second electrode 122 is preferably 7 μm or more. Thereby, the diffusion of silver can be more effectively prevented. A thickness of the aluminum layer in the second electrode 122 is preferably 2 μm or more. Thereby, the diffusion of nickel can be more effectively prevented.

In the P-type chip 12, the upper second electrode 122 connected to the substrate 13 on a high temperature side has the above-described configuration, but it is not indispensable that the lower second electrode 122 connected to the substrate 13 on a low temperature side have the above-described configuration. However, when both the upper and lower second electrodes 122 are configured as described above, the heat resistance is further enhanced and plating treatment can be efficiently performed.

Working Examples and Comparative Examples

Hereinafter, working examples as examples of the configuration of the above-described embodiment, and comparative examples as examples of a configuration different from the above-described embodiment will be explained. However, the present invention is not limited to configurations of the working examples described below. Specifically, in the working examples and the comparative examples, the effect of the aluminum layer 112b and effects of the aluminum layer 112b and the nickel layer 112c were observed.

(Effect of Aluminum Layer 112b)

In order to confirm the effect of the aluminum layer 112b as the diffusion prevention layer for nickel in the first electrode 112 of the N-type chip 11, a sample of an N-type chip according to a comparative example in which the aluminum layer 112b was not provided was prepared.

Since the aluminum layer 112b was not provided in the sample of the N-type chip according to the comparative example, the titanium layer 112a serving as the adhesion layer for enhancing adhesion between the N-type element 111 and the aluminum layer 112b also was not provided. That is, the first electrode of the sample according to the comparative example was constituted by the nickel layer 112c and the gold layer 112d.

Figure 6:
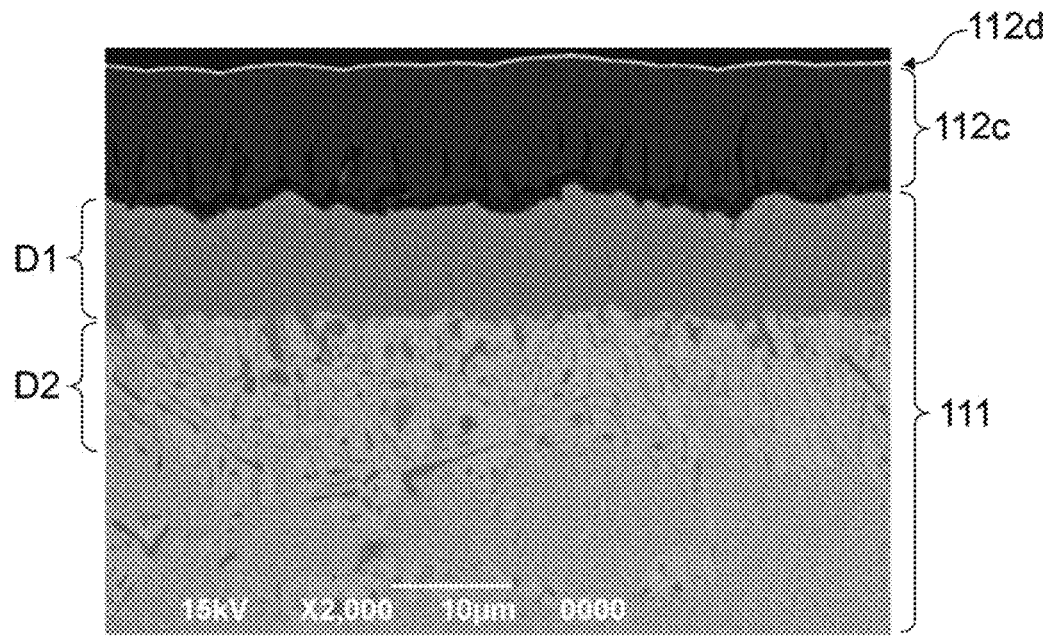
FIG. 6 is a microstructural image of a cross section of a sample of an N-type chip according to a comparative example.

Assuming a state of the thermoelectric conversion module 10 in use, heat treatment at 310° C. for 100 hours was applied to the sample according to the comparative example. FIG. 6 is a microstructural image of a cross section of the sample according to the comparative example after the heat treatment. It can be confirmed that altered layers D1 and D2 in which structures are altered were formed on the first electrode side of the N-type element 111.

The altered layers D1 and D2 formed in the N-type element 111 of the sample according to the comparative example are nickel diffusion layers formed by the nickel constituting the nickel layer 112c diffusing into the N-type element 111. In the altered layer D1 adjacent to the first electrode, a nickel concentration is higher than that of the altered layer D2.

Next, a sample of the N-type chip 11 according to a working example in which the aluminum layer 112b was provided was prepared. Heat treatment at 310° C. for 100 hours was applied also to the sample according to the working example in the same manner. Further, in the sample of the N-type chip 11 according to the working example, configurations other than the titanium layer 112a and the aluminum layer 112b were the same as those in the sample of the N-type chip according to the comparative example.

Figure 7:
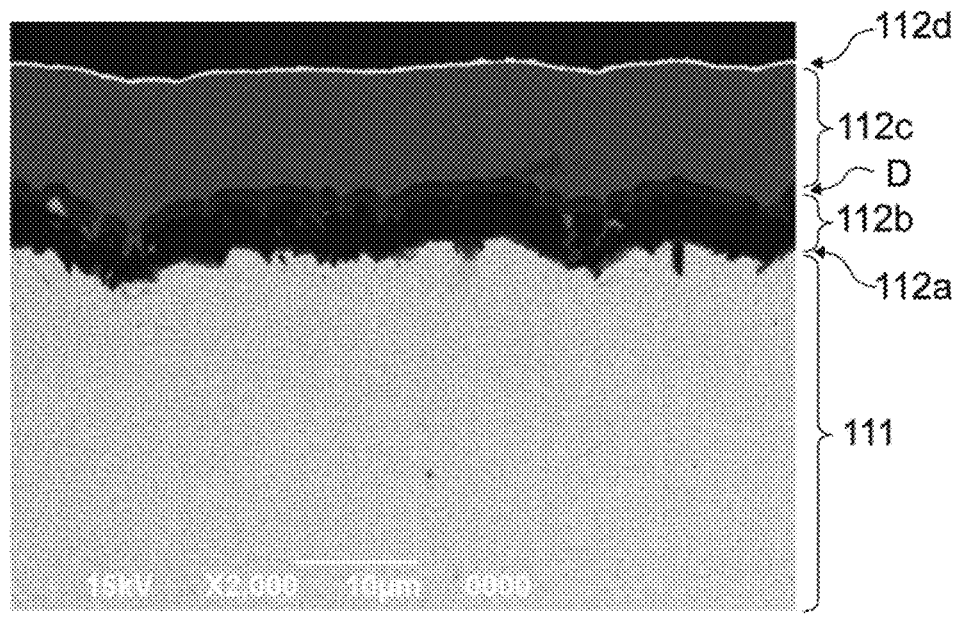
FIG. 7 is a microstructural image of a cross section of a sample of an N-type chip according to a working example.

FIG. 7 is a microstructural image of a cross section of the sample according to the working example after the heat treatment. In the sample according to the working example, unlike the sample according to the comparative example, a nickel diffusion layer was not found in the N-type element 111. Thereby, the effect of preventing diffusion of the nickel constituting the nickel layer 112c into the N-type element 111 by the aluminum layer 112b was confirmed.

When FIG. 7 is observed in more detail, a diffusion layer D in which aluminum and nickel diffuse into each other is seen between the aluminum layer 112b and the nickel layer 112c. However, the nickel does not diffuse to the N-type element 111 side further than the diffusion layer D. That is, the nickel does not reach the titanium layer 112a.

Therefore, the effect of preventing the diffusion of nickel included in the nickel layer 112c into the N-type element 111 is thought to have been obtained only by the aluminum layer 112b regardless of the presence or absence of the titanium layer 112a. Therefore, when the adhesion between the N-type element 111 and the aluminum layer 112b can be obtained, the titanium layer 112a is unnecessary.

(Effects of Aluminum Layer 112b and Nickel Layer 112c)

Next, in order to confirm effects of the aluminum layer 112b and the nickel layer 112c, a sample of the N-type chip 11 according to a working example and samples of N-type chips according to comparative examples 1 and 2 were prepared. In the samples according to the comparative examples 1 and 2, the aluminum layer 112b was not provided, and thicknesses of the nickel layers 112c were different from each other.

Specifically, in the sample of the N-type chip according to the comparative example 1, the thickness of the nickel layer 112c was set to 4 µm. In the sample according to the comparative example 2, the thickness of the nickel layer 112c was set to 10 µm. Therefore, the sample according to the comparative example 2 has a configuration in which the silver constituting the bonding layer 14 is less likely to diffuse into the N-type element 111 than that in the sample according to the comparative example 1.

Also, in the sample of the N-type chip 11 according to the working example, the thickness of the nickel layer 112c was set to 10 µm. Therefore, the sample according to the working example has a configuration in which the silver constituting the bonding layer 14 does not easily diffuse to the N-type element 111 as in the sample according to the comparative example 2. Further, in the sample according to the working example, a thickness of the aluminum layer 112b was set to 4 µm.

For the samples according to the working example and the comparative examples 1 and 2, electrical resistance measurement was performed while maintaining a high temperature in a state in which a silver paste was disposed on the gold layer 112d. The electrical resistance measurement was performed at a holding temperature of 330° C. for 200 hours under a nitrogen atmosphere. Then, for each of the samples, a change rate ΔR of electrical resistance at each time with respect to before heating was calculated.

Figure 8:
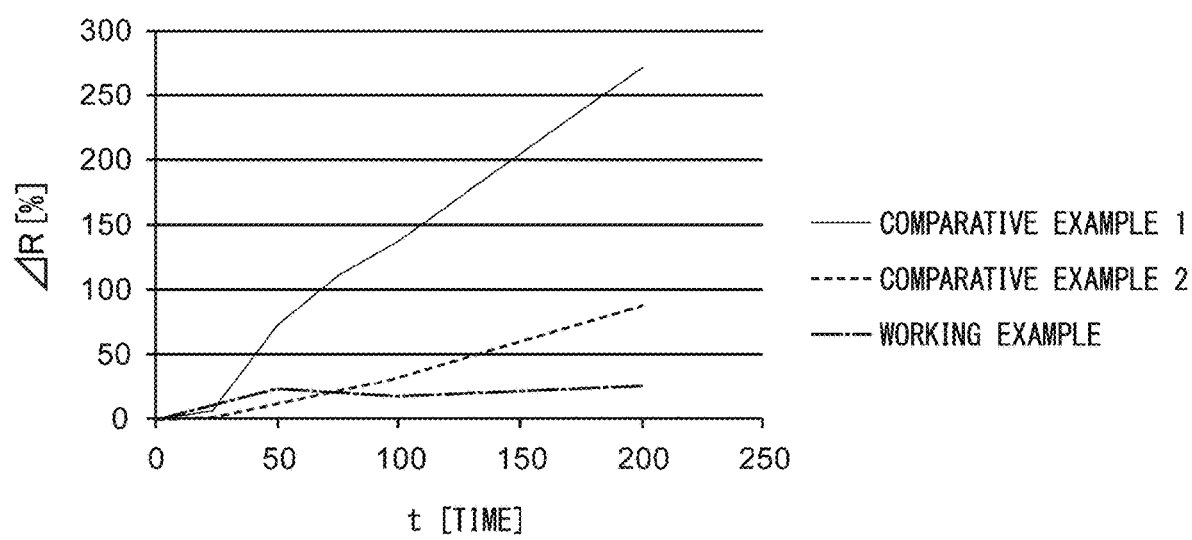
FIG. 8 is a graph showing temporal change in change rate ΔR of electrical resistance due to heating in samples of an N-type chip according to a working example and comparative examples.

FIG. 8 is a graph showing temporal changes in the change rate ΔR of the samples according to the working example and the comparative examples 1 and 2. In FIG. 8, the horizontal axis represents a retaining time t (time) at 330° C. of each sample, and the vertical axis represents the change rate ΔR (%) of electrical resistance of each sample. The comparative example 1 is shown by a solid line, the comparative example 2 is shown by a broken line, and the working example is shown by a dashed-dotted line.

First, the comparative examples 1 and 2 are compared. In the sample according to the comparative example 1 in which the nickel layer 112c is thin, the temporal change of the change rate ΔR is larger than that of the sample according to the comparative example 2. It is thought that this is because, in the sample according to the comparative example 1, an amount of the silver constituting the bonding layer 14 diffused into the N-type element 111 was larger than that in the sample according to the comparative example 2.

Next, the comparative example 2 and the working example in which thicknesses of the nickel layers 112c are equal to each other are compared. The change rate ΔR increases with the elapse of time in the sample according to the comparative example 2 in which the aluminum layer 112b is not provided. By contrast, almost no temporal change in the change rate ΔR is found in the sample according to the working example in which the aluminum layer 112b is provided.

In the sample according to the comparative example 2, it is thought that the electrical resistance increased by progress of diffusion of the nickel constituting the nickel layer 112c into the N-type element 111 with passage of time. In contrast, in the sample according to the working example, it is thought that diffusion of the nickel into the N-type element 111 was prevented by the aluminum layer 112b.

Other Embodiments

Although the embodiments of the present invention have been described above, the present invention is not limited only to the above-described embodiments, and various modifications can be added to the scope of the present invention without departing from the spirit of the present invention.

For example, although the thermoelectric conversion module with only one layer of the thermoelectric elements has been described above, the embodiment of the present invention is not limited to this. The above embodiment is also applicable to a multistage thermoelectric conversion module in which layers of thermoelectric elements are formed in multiple stages. Also, although each substrate is configured to be integrally formed in the thermoelectric conversion module according to the above-described embodiment, the substrate may be appropriately divided according to a pattern of the metalized layer.

Further, although the thermoelectric conversion module used for thermoelectric power generation has been mainly described in the above-described embodiment, applications of the thermoelectric conversion module according to the embodiment of the present invention are not limited to thermoelectric power generation. As an example, the thermoelectric conversion module of the embodiment of the present invention can obtain excellent heat resistance even when it is used as a cooling element utilizing a Peltier effect.

What is claimed is:

1. A thermoelectric conversion module comprising:
a high temperature side substrate;
a low temperature side substrate;

a plurality of thermoelectric elements including an N-type element and a P-type element;
a bonding layer including silver and disposed between the high temperature side substrate and the plurality of thermoelectric elements;
a first electrode disposed between the bonding layer and the N-type element and connecting the N-type element with the bonding layer, the first electrode including a first nickel layer and an aluminum layer that is disposed between the first nickel layer and the N-type element; and
a second electrode that connects the P-type element with the bonding layer, the second electrode including a second nickel layer;
a third electrode disposed between the low temperature side substrate and the N-type element, the third electrode including a third nickel layer; and
a fourth electrode disposed between the low temperature side substrate and the P-type element, the fourth electrode including a fourth nickel layer,
wherein the high temperature side substrate includes a conductive film connecting the N-type element and the P-type element in series, and the bonding layer is disposed between the conductive film and the first electrode.

2. The thermoelectric conversion module according to claim 1, wherein a thickness of the aluminum layer is 2 µm or more.

3. The thermoelectric conversion module according to claim 1, wherein a thickness of the first nickel layer is 7 µm or more.

4. The thermoelectric conversion module according to claim 1, wherein the plurality of thermoelectric elements are formed of a bismuth telluride-based compound.

5. The thermoelectric conversion module according to claim 4, wherein the first electrode further includes a titanium layer adjacent to the N-type element.

6. The thermoelectric conversion module according to claim 1, wherein each of the first electrode and the second electrode further includes a gold layer adjacent to the bonding layer.

7. The thermoelectric conversion module according to claim 1, wherein the second electrode further includes an aluminum layer disposed between the second nickel layer and the P-type element.

8. The thermoelectric conversion module according to claim 1, wherein the bonding layer includes a sintered material of silver.

9. A thermoelectric conversion module comprising:
a high temperature side substrate;
a low temperature side substrate;
a plurality of thermoelectric elements including an N-type element and a P-type element;
a bonding layer including silver and disposed between the high temperature side substrate and the plurality of thermoelectric elements;
a first electrode disposed between the bonding layer and the N-type element and connecting the N-type element with the bonding layer, the first electrode including a first nickel layer and an aluminum layer that is disposed between the first nickel layer and the N-type element; and
a second electrode that connects the P-type element with the bonding layer, the second electrode including a second nickel layer;
a third electrode disposed between the low temperature side substrate and the N-type element, the third electrode including a third nickel layer; and
a fourth electrode disposed between the low temperature side substrate and the P-type element, the fourth electrode including a fourth nickel layer,
wherein the high temperature side substrate includes a conductive film connecting the N-type element and the P-type element in series, a first surface of the bonding layer directly contacts the conductive film, and a second surface of the bonding layer directly contacts the first electrode.

10. The thermoelectric conversion module according to claim 9, wherein the first electrode further includes a first conductive layer and a second conductive layer sandwiching the first nickel layer and the aluminum layer such that the first conductive layer is disposed between the N-type element and the aluminum layer, and the second conductive layer is disposed between the bonding layer and the first nickel layer and directly contacts the second surface of the bonding layer.

11. The thermoelectric conversion module according to claim 10, wherein a thickness of the first nickel layer is in a range of 7 µm to 50 µm, and a thickness of the aluminum layer is in a range of 2 µm to 50 µm.

12. A thermoelectric conversion module comprising:
a high temperature side substrate;
a low temperature side substrate;
a plurality of thermoelectric elements including an N-type element and a P-type element;
a bonding layer including silver and disposed between the high temperature side substrate and the plurality of thermoelectric elements;
a first electrode disposed between the bonding layer and the N-type element and connecting the N-type element with the bonding layer, the first electrode including a first nickel layer and an aluminum layer that is disposed between the first nickel layer and the N-type element; and
a second electrode that connects the P-type element with the bonding layer, the second electrode including a second nickel layer;
a third electrode disposed between the low temperature side substrate and the N-type element, the third electrode including a third nickel layer; and
a fourth electrode disposed between the low temperature side substrate and the P-type element, the fourth electrode including a fourth nickel layer,
wherein the first electrode further includes a first conductive layer and a second conductive layer sandwiching the first nickel layer and the aluminum layer such that the first conductive layer is disposed between the N-type element and the aluminum layer, and the second conductive layer is disposed between the bonding layer and the first nickel layer.

13. The thermoelectric conversion module according to claim 1,
wherein a thickness of the first nickel layer is in a range of 7 µm to 50 µm, and a thickness of the aluminum layer is in a range of 2 µm to 50 µm.

* * * * *